(12) United States Patent
Park et al.

(10) Patent No.: US 7,105,999 B2
(45) Date of Patent: Sep. 12, 2006

(54) ORGANIC ELECTROLUMINESCENT DISPLAY DEVICE AND METHOD OF FABRICATING THE SAME

(75) Inventors: Jae-Yong Park, Gyeonggi-do (KR); Choong-Keun Yoo, Incheon (KR); Ock-Hee Kim, Gyeonggi-do (KR); Nam-Yang Lee, Gyeonggi-do (KR); Kwan-Soo Kim, Gyeonggi-do (KR)

(73) Assignee: LG.Philips LCD Co., Ltd., Tokyo (JP)

( * ) Notice: Subject to any disclaimer, the term of this patent is extended or adjusted under 35 U.S.C. 154(b) by 75 days.

(21) Appl. No.: 10/608,229

(22) Filed: Jun. 30, 2003

(65) Prior Publication Data
US 2004/0004432 A1    Jan. 8, 2004

(30) Foreign Application Priority Data
Jul. 5, 2002   (KR) ...................... 10-2002-0038812

(51) Int. Cl.
*H05B 33/02*   (2006.01)

(52) U.S. Cl. ........................ 313/505; 313/504; 313/506

(58) Field of Classification Search ................ 313/501, 313/504, 505, 506, 512, 318; 445/25
See application file for complete search history.

(56) References Cited

U.S. PATENT DOCUMENTS

| 6,175,345 | B1 | 1/2001 | Kuribayashi et al. | |
| 6,548,961 | B1 | 4/2003 | Barth et al. | |
| 2002/0158577 | A1* | 10/2002 | Shimoda et al. | 313/506 |
| 2003/0178936 | A1 | 9/2003 | Park et al. | |
| 2004/0100191 | A1* | 5/2004 | Park | 313/506 |

FOREIGN PATENT DOCUMENTS

| EP | 0 883 191 | 12/1998 |
| EP | 1 311 666 | 7/2003 |
| FR | 2 836 599 | 8/2003 |
| JP | 2001-177509 | 4/2001 |
| JP | 2003-66859 | 3/2003 |
| KR | 2002-0047889 | 6/2002 |
| KR | 2004-0079476 | 9/2004 |
| WO | 01/62051 | 2/2001 |

(Continued)

*Primary Examiner*—Nimeshkumar D. Patel
*Assistant Examiner*—Matt Hodges
(74) *Attorney, Agent, or Firm*—Morgan, Lewis & Bockius, LLP

(57) ABSTRACT

An organic electroluminescent display device includes first and second substrates facing and spaced apart from each other, the first and second substrates having a plurality of pixel regions and a peripheral region surrounding the plurality of pixel regions, a first pad disposed at the peripheral region on an inner surface of the first substrate, a driving thin film transistor disposed at each of the plurality of pixel regions on the inner surface of the first substrate, the driving thin film transistor including an active layer, a gate electrode, and source and drain electrodes, a first connection electrode structure connected to the drain electrode, a second connection electrode structure connected to the first pad, the second connection electrode structure being the same as the first connection electrode structure, a first electrode on an entire inner surface of the second substrate, the first electrode being connected to the second connection electrode structure, an organic emission layer on the first electrode, a second electrode on the organic emission layer at each of the plurality of pixel regions, the second electrode being connected to the first connection electrode structure, and a sealant attaching the first and second substrates together.

20 Claims, 11 Drawing Sheets

FOREIGN PATENT DOCUMENTS

WO  WO 02/078101  10/2002
WO  WO-02/078101  10/2002

* cited by examiner

ORGANIC ELECTROLUMINESCENT DISPLAY DEVICE AND METHOD OF FABRICATING THE SAME

The present invention claims the benefit of Korean Patent Application No. 2002-38812 filed in Korea on Jul. 5, 2002, which is hereby incorporated by reference.

BACKGROUND OF THE INVENTION

1. Field of the Invention

The present invention relates to a display device and a method of fabricating a display device, and more particularly to an organic electroluminescent display device and a method of fabricating an organic electroluminescent display device.

2. Discussion of the Related Art

In general, an organic electroluminescent display (OELD) device emits light by injecting electrons from a cathode and holes from an anode into an emission layer, combining the electrons and the holes, generating an exciton, and transitioning the exciton from an excited state to a ground state. Contrary to a liquid crystal display (LCD) device, an additional light source is not necessary for the OELD devices to emit light because the transition of the exciton between states causes light to be emitted from the emission layer. Accordingly, size and weight of the OELD devices can be reduced. Since the OELD devices have low power consumption, superior brightness, and fast response time, the OELD devices are being incorporated in consumer electronic products, such as cellular phones, car navigation system (CNS), personal digital assistants (PDA), camcorders, and palmtop computers. Moreover, since fabrication of the OELD devices is simple, it is much cheaper to produce OELD devices than LCD devices.

OELD devices may be categorized into passive matrix OELD devices and active OELD matrix devices. Although the passive matrix OELD devices have a simple structure and are formed using simple fabricating processes, the passive matrix OELD devices require relatively high amounts of power to operate and display sizes of the passive matrix OELD devices are limited by their structures. In addition, as a total number of conductive lines increases, aperture ratios of the passive matrix OELD devices decrease. In contrast, the active matrix OELD devices have a high emission efficiency and can produce high-quality images for large displays using relatively low power.

FIG. 1 is a schematic cross sectional view of an OELD device according to the related art. In FIG. 1, an array unit 14 including a thin film transistor (TFT) "T" is formed on a first substrate 12. A first electrode 16, an organic electroluminescent layer 18, and a second electrode 20 are sequentially formed on the array unit 14, wherein the organic electroluminescent layer 18 may separately display red, green, and blue colors for each pixel region. In general, separate organic materials are commonly used to emit light of each color for the organic electroluminescent layer 18 in each pixel region. An organic ELD device is encapsulated by attaching the first substrate 12 and a second substrate 28, which includes a moisture absorbent material 22, with a sealant 26. The moisture absorbent material 22 eliminates any moisture and oxygen that may penetrate into a capsule of the organic electroluminescent layer 18. After etching a portion of the second substrate 28, the etched portion is filled with the moisture absorbent material 22 and the filled moisture absorbent material is fixed by a holding element 25.

FIG. 2 is a schematic plan view of an array unit of an OELD device according to the related art. In FIG. 2, an array unit of an OELD device includes a switching element "$T_S$," a driving element "$T_D$," and a storage capacitor "$C_{ST}$," wherein the switching element "$T_S$" and the driving element "$T_D$" may include a combination of at least one thin film transistor (TFT). A transparent insulating substrate 12 upon which the array unit is formed may be made of glass or plastic material. A gate line 32 and a data line 34 crossing each other are formed on the substrate 12, wherein a pixel region "P" is defined by the crossing of the gate line 32 and the data line 34. An insulating layer (not shown) is interposed between the gate line 32 and the data line 34, and a power line 35 parallel to and spaced apart from the data line 34 crosses the gate line 32.

The switching element "$T_S$" is a thin film transistor including a switching gate electrode 36, a switching active layer 40, and a switching source and drain electrodes 46 and 50. Similarly, a driving element "$T_D$" is a thin film transistor including a driving gate electrode 38, a driving active layer 42, and a driving source and drain electrodes 48 and 52. The switching gate electrode 36 is connected to the gate line 32 and the switching source electrode 46 is connected to the data line 34, and the switching drain electrode 50 is connected to the driving gate electrode 38 through a first contact hole 54. The driving source electrode 48 is connected to the power line 35 through a second contact hole 56. In addition, the driving drain electrode 52 is connected to a first electrode 16 at the pixel region "P." The power line 35 overlaps a first capacitor electrode 15 with the insulating layer interposed therebetween to form the storage capacitor "$C_{ST}$."

FIG. 3 is a schematic plan view of an OELD device according to the related art. In FIG. 3, a substrate 12 includes a data pad region "E" at a first side and first and second gate pad regions "$F_1$" and "$F_2$" at second and third sides adjacent to the first side. A common electrode 39 is formed at a fourth side facing the first side and adjacent to the second and third sides of the substrate 12, wherein a common voltage is applied to a second electrode 20 through the common electrode 39 to maintain an electrical potential of the second electrode 20. Accordingly, a display region at a center of the substrate 12 is used for displaying images.

FIG. 4A is a schematic cross sectional view along IVa—IVa of FIG. 2 according to the related art, and FIG. 4B is a schematic cross sectional view along IVb—IVb of FIG. 3 according to the related art. In FIGS. 4A and 4B, a driving thin film transistor (TFT) "$T_D$" including a driving active layer 42, a driving gate electrode 38, and driving source and drain electrodes 56 and 52 are formed on a substrate 12. An insulating layer 57 is formed on the driving TFT "$T_D$" and a first electrode 16 connected to the driving drain electrode 52 is formed on the insulating layer 57. An organic emission layer 18 for emitting light of a specific color is formed on the first electrode 16 and a second electrode 20 is formed on the organic emission layer 18. A storage capacitor "$C_{ST}$" is formed to be electrically parallel to the driving TFT "$T_D$" and includes first and second capacitor electrodes 15 and 35, wherein a portion of a power line overlapping the first capacitor electrode 15 is used as the second capacitor electrode 35, the second capacitor electrode 35 is connected to the driving source electrode 56, and the second electrode 20 is formed on an entire surface of the substrate 12 including the driving TFT "$T_D$," the storage capacitor "$C_{ST}$," and the organic emission layer 18.

A common electrode 39 through which a common voltage is applied to the second electrode 20 is formed at a peripheral portion of the substrate 12, wherein the common electrode 39 is simultaneously formed with the driving source and drain electrodes 56 and 52. Multiple insulating layers on the common electrode 39 include first and second contact holes 50 and 52 exposing the common electrode 39, and the second electrode 20 is connected to the common electrode 39 through the first contact hole 50. Although not shown, an external circuit is connected to the common electrode 39 through the second contact hole 52 to supply the common voltage.

However, when an array unit and an emission unit are formed on one substrate, production yield of an OELD device is determined by a multiplication of TFT yield and organic emission layer yield. Since the organic emission layer yield is relatively low, the production yield of an ELD is limited by the organic layer yield. For example, even when a TFT is fabricated, an OELD device can be determined to be bad due to defects of an organic emission layer. Accordingly, production materials are lost and production costs rise.

In general, OELD devices are classified into bottom emission-type OELD devices and top emission-type OELD devices according to an emission direction of light used for displaying images. Although bottom emission-type OELD devices have advantages of high encapsulation stability and high process flexibility, they are ineffective for high resolution devices because they have poor aperture ratios. In contrast, top emission-type OELD devices have higher expected life spans because they are easily designed and have high aperture ratios. However, in top emission-type OELD devices, the cathode is commonly formed on an organic emission layer, wherein transmittance and optical efficiency are reduced since a limited number of materials may be selected. When a thin film protection layer is used to minimize the transmittance reduction, the top emission-type OELD devices are not sufficiently shielded from ambient air.

SUMMARY OF THE INVENTION

Accordingly, the present invention is directed to an organic electroluminescent display device and a method of fabricating an organic electroluminescent display device that substantially obviate one or more of the problems due to limitations and disadvantages of the related art.

An object of the present invention is to provide an organic electroluminescent display device having an array unit and an organic emission layer on separate substrates.

An object of the present invention is to provide a method of fabricating an organic electroluminescent display device by forming an array unit and an organic emission layer on separate substrates and attaching the substrates.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes first and second substrates facing and spaced apart from each other, the first and second substrates having a plurality of pixel regions and a peripheral region surrounding the plurality of pixel regions, a first pad disposed at the peripheral region on an inner surface of the first substrate, a driving thin film transistor disposed at each of the plurality of pixel regions on the inner surface of the first substrate, the driving thin film transistor including an active layer, a gate electrode, and source and drain electrodes, a first connection electrode structure connected to the drain electrode, a second connection electrode structure connected to the first pad, the second connection electrode structure being the same as the first connection electrode structure, a first electrode on an entire inner surface of the second substrate, the first electrode being connected to the second connection electrode structure, an organic emission layer on the first electrode, a second electrode on the organic emission layer at each of the plurality of pixel regions, the second electrode being connected to the first connection electrode structure, and a sealant attaching the first and second substrates together.

In another aspect, a method of fabricating an organic electroluminescent device includes forming a first insulating layer on a first substrate having a plurality of pixel regions and a peripheral region surrounding the plurality of pixel regions, forming an active layer on the first insulating layer at each of the plurality of pixel regions, the active layer including polycrystalline silicon and having source and drain regions, forming a second insulating layer on the active layer, forming a gate electrode on the second insulating layer over the active layer, forming a third insulating layer on the gate electrode, the third insulating layer having a first contact hole exposing the source region and a second contact hole exposing the drain region, forming source and drain electrodes and a first pad on the third insulating layer, the source electrode being connected to the source region through the first contact hole, the drain electrode being connected to the drain region through the second electrode, and the first pad being disposed at the peripheral region, forming a fourth insulating layer on the source and drain electrodes and the first pad, the fourth insulating layer having a third contact hole exposing the drain electrode, and fourth and fifth contact holes exposing the first pad, forming first and second connection electrodes on the fourth insulating layer, the first connection pattern being connected to the drain electrode through third contact hole, the second connection electrode being connected to the first pad through the fourth contact hole, forming a first electrode on a second substrate having a plurality of pixel regions and a peripheral region surrounding the plurality of pixel regions, forming an organic emission layer on the first electrode, forming a second electrode on the organic emission layer at each of the plurality of pixel regions, and attaching the first and second substrates together with a sealant material, wherein the first connection electrode contacts the second electrode, and the second connection electrode contacts the first electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 5:
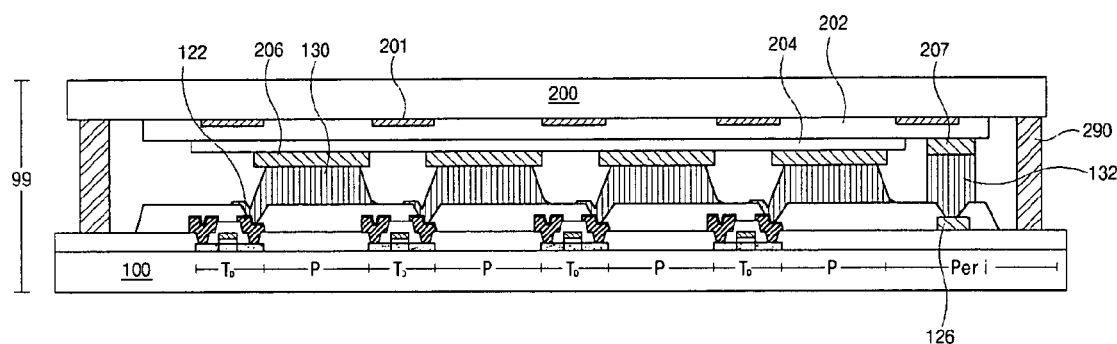
FIG. 5 is a schematic cross sectional view of an exemplary OELD device according to the present invention.

FIG. 5 is a schematic cross sectional view of an exemplary OELD device according to the present invention. In FIG. 5, an OELD device 99 may be fabricated by attaching first and second substrates 100 and 200 using a sealant 290, wherein the first and second substrates 100 and 200 may include a plurality of pixel regions "P" and a peripheral region "Peri" surrounding the plurality of pixel regions "P." In addition, a driving thin film transistor (TFT) "$T_D$" may be disposed on an inner surface of the first substrate 100 adjacent to each of the plurality of pixel regions "P." Although not shown, a plurality of array lines may be formed on the inner surface of the first substrate 100. A plurality of first auxiliary electrodes 201 may be formed on an inner surface of the second substrate 200 and a first electrode 202 may be formed on the plurality of first auxiliary electrodes 201, wherein the first electrode 202 may function as a transparent anode for injecting holes. An organic emission layer 204 may be formed on the first electrode 202 and a plurality of second electrodes 206 may be formed on the organic emission layer 204 at each of the plurality of pixel regions "P," wherein the plurality of second electrodes 206 may function as cathodes for injecting electrons. In addition, a second auxiliary electrode 207 may be simultaneously formed on the first electrode 202 at the peripheral region "Peri" with the plurality of second electrodes 206.

The second electrode 206 may be electrically connected to a drain electrode 122 of the driving TFT "$T_D$" through a first connection electrode 130. Then, the first connection electrode 130 may be provided to contact the second electrode 206 by attaching the first and second substrates 100 and 200. Next, a first pad 126 may be formed on the inner surface of the first substrate 100 at the peripheral region "Peri," and a second connection electrode 132 may be formed over the first pad 126 to contact the first pad 126, wherein the second connection electrode 132 may be electrically connected to the first electrode 202 through the second auxiliary electrode 207 by attaching the first and second substrates 100 and 200. Alternatively, when the second auxiliary electrode 207 may not be formed, the second connection electrode 132 may directly contact the first electrode 202.

The first and second connection electrodes 130 and 132 may be formed of multiple layers to improve contact resistance with the drain electrode 122, the first pad 126, the second electrode 206, and the second auxiliary electrode 207. In addition, the first pad 126 may be formed of multiple layers to improve contact resistance with the second connection electrode 132, and a power may be provided to the first pad 126 for driving the emission layer 204.

Figure 1:
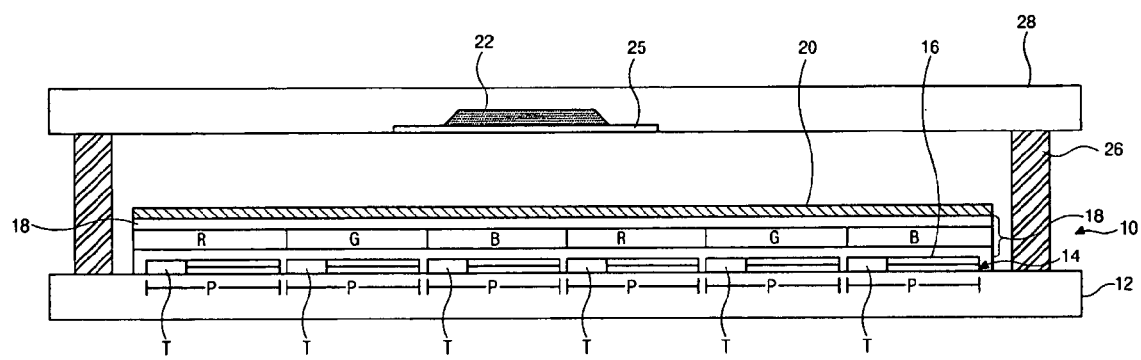
FIG. 1 is a schematic cross sectional view of an OELD device according to the related art.
Figure 2:
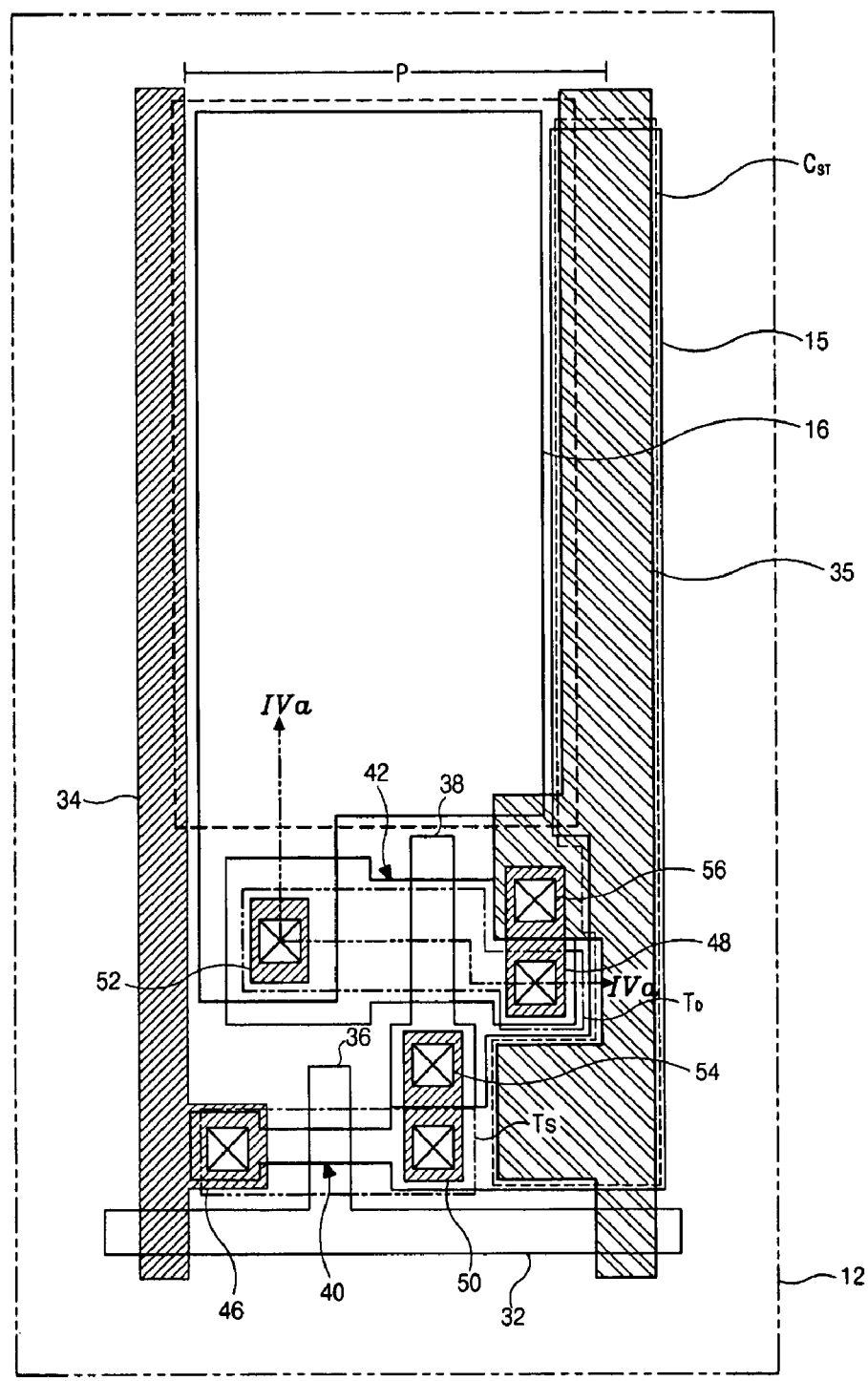
FIG. 2 is a schematic plan view of an array unit of an OELD device according to the related art.
Figure 3:
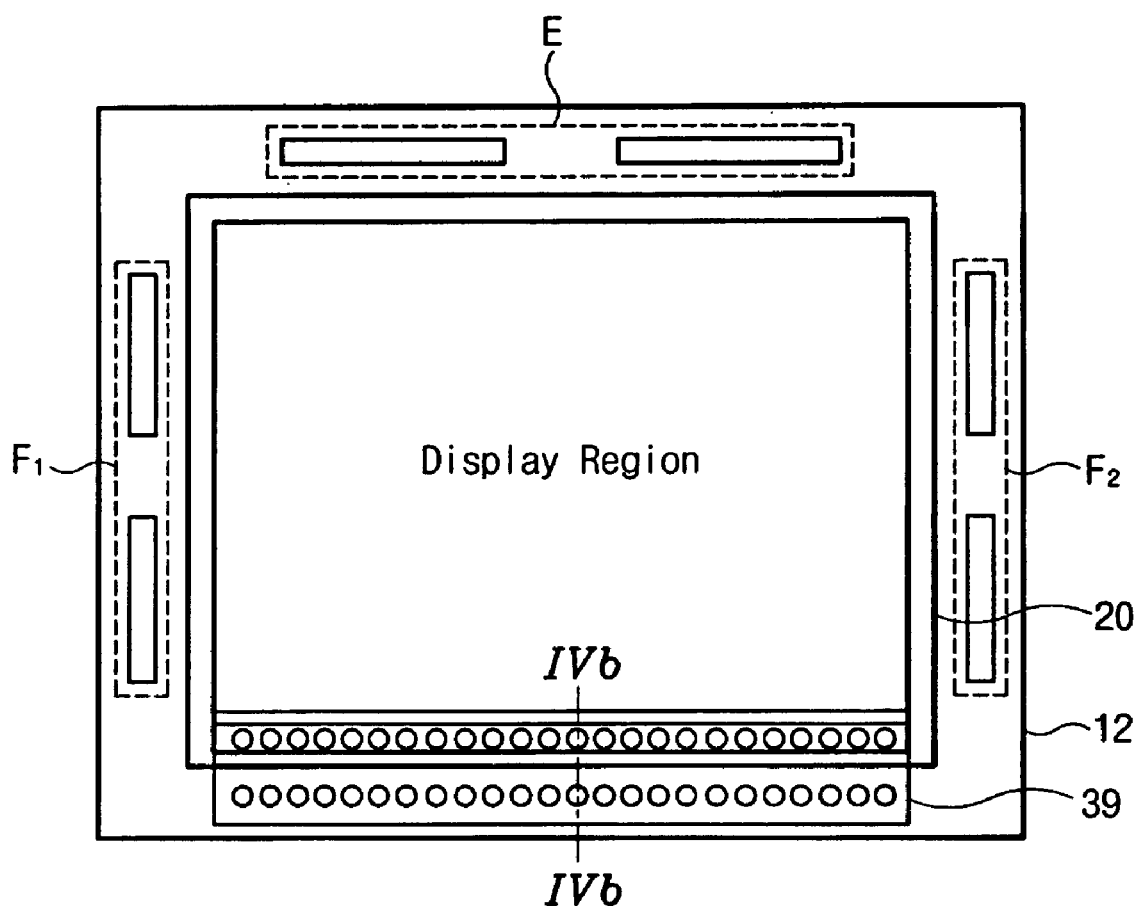
FIG. 3 is a schematic plan view of an OELD device according to the related art.
Figure 4A:
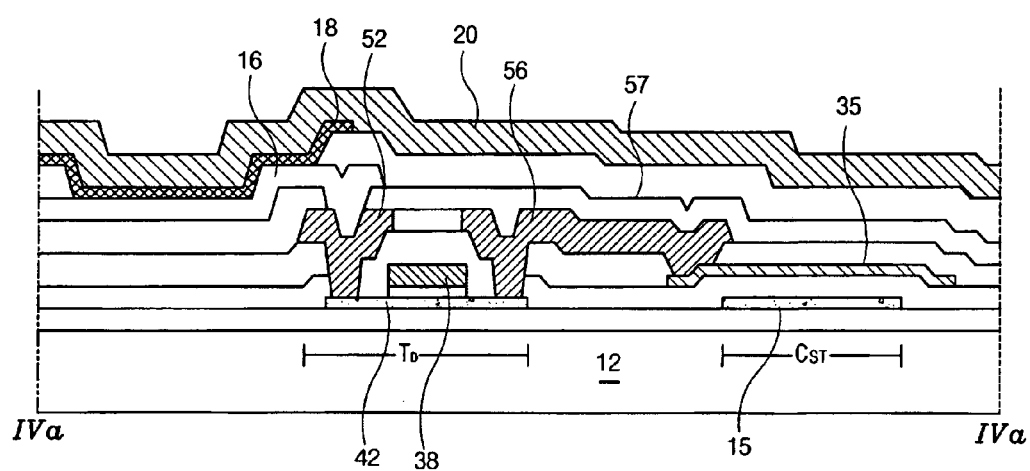
FIG. 4A is a schematic cross sectional view along IVa—IVa of FIG. 2 according to the related art.
Figure 4B:
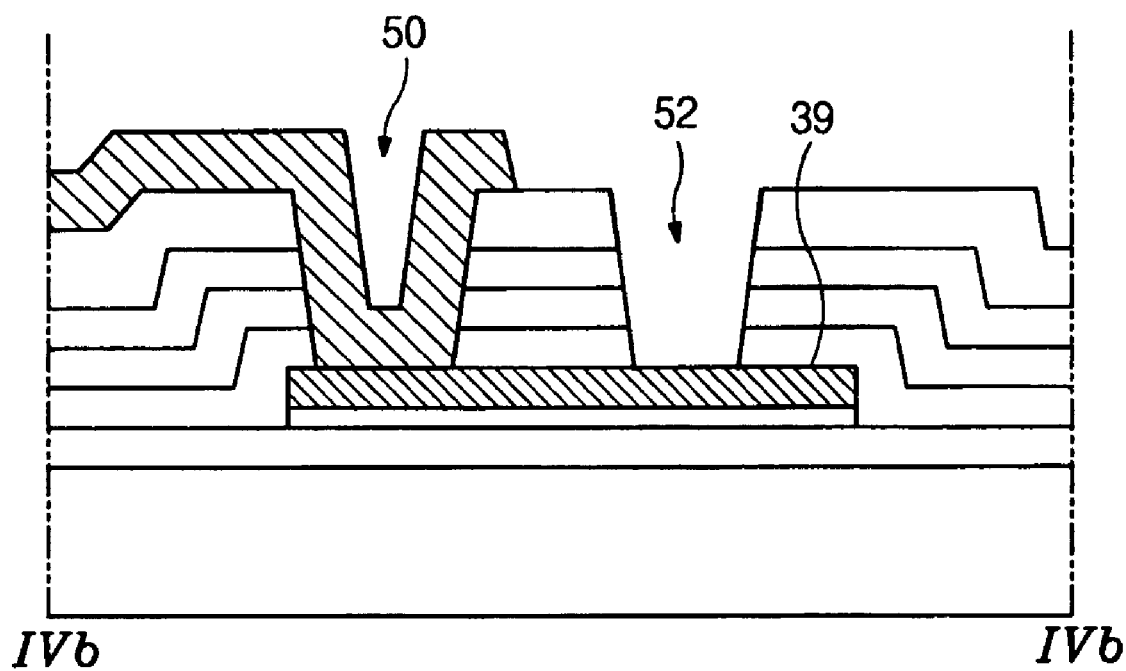
FIG. 4B is a schematic cross sectional view along IVb—IVb of FIG. 3 according to the related art.
Figure 6A:
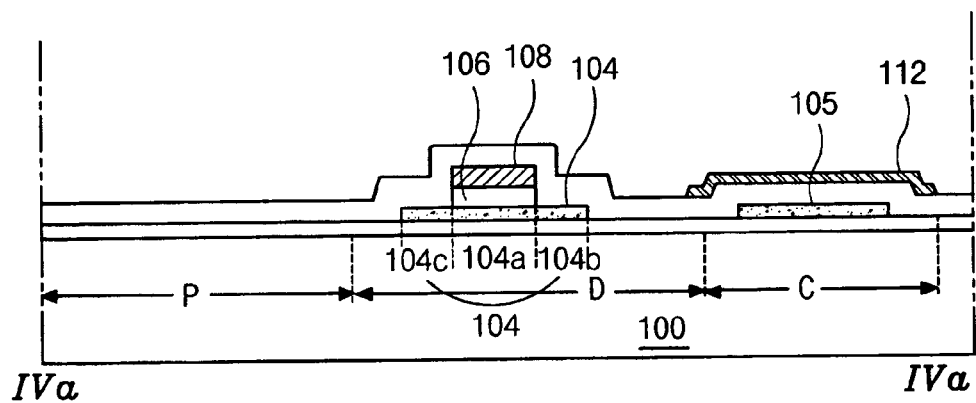
FIGS. 6A to 6C are schematic cross sectional views of an exemplary method of fabricating a pixel region of a first substrate for an OELD device according to the present invention.
Figure 6B:
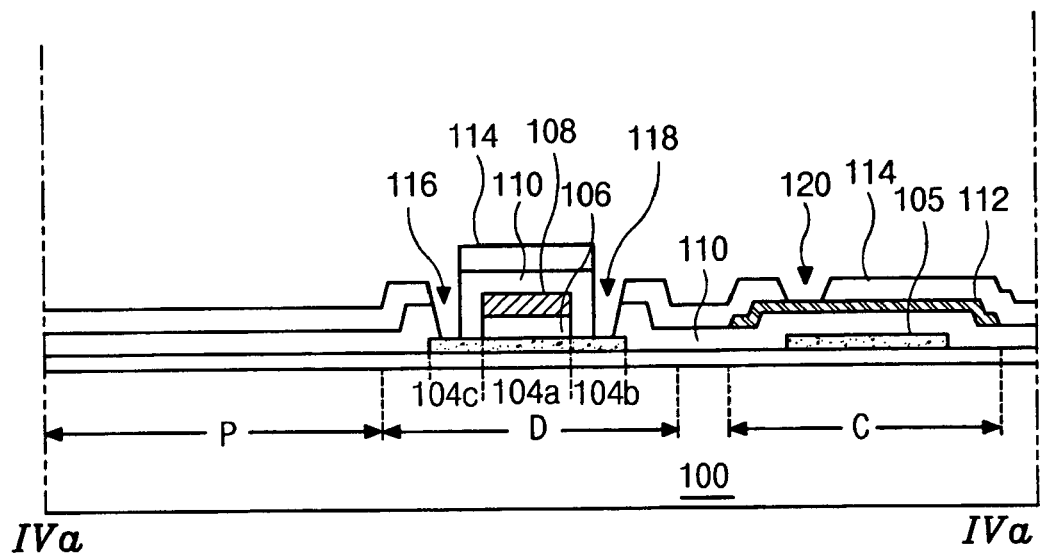
Figure 6C:
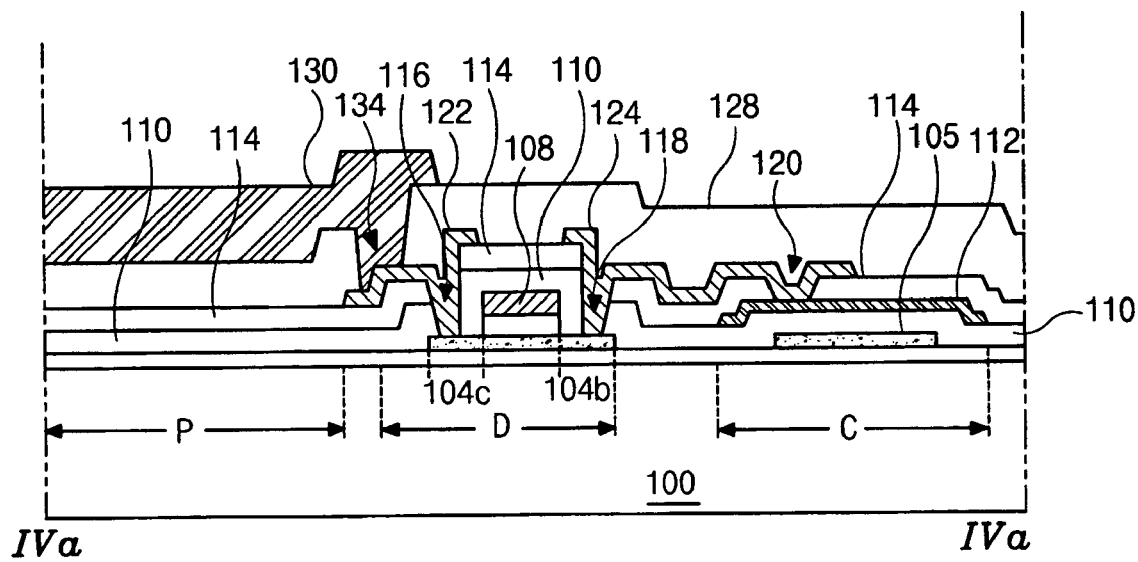
Figure 7A:
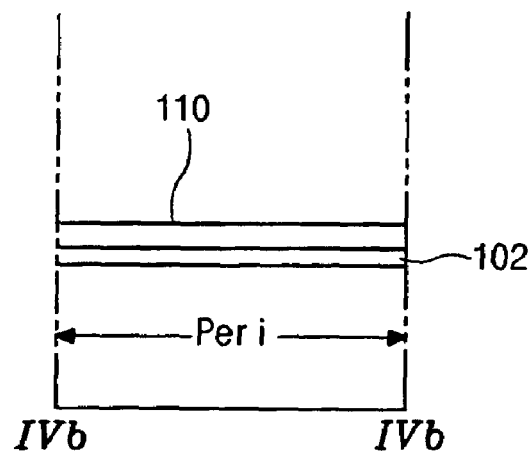
FIGS. 7A to 7C are schematic cross sectional views of an exemplary method of fabricating a peripheral region of a first substrate for an OELD device according to the present invention.
Figure 7B:
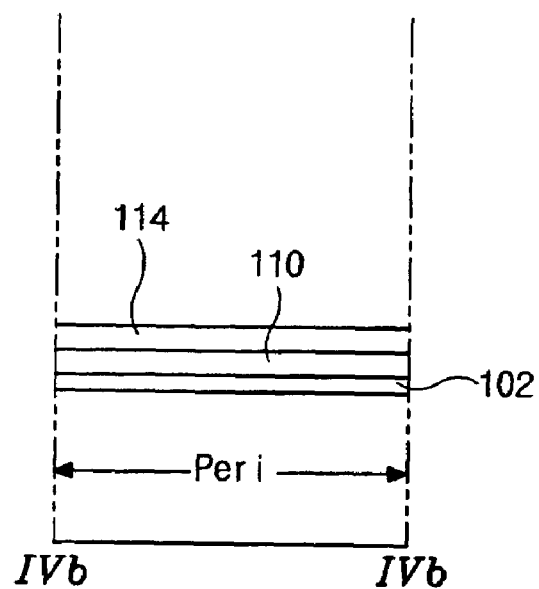
Figure 7C:
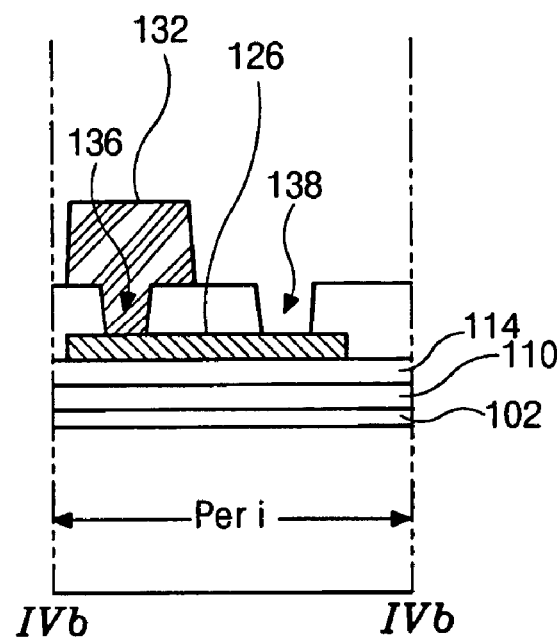

FIGS. 6A to 6C are schematic cross sectional views of an exemplary method of fabricating a pixel region of a first substrate for an OELD device according to the present invention, and FIGS. 7A to 7C are schematic cross sectional views of an exemplary method of fabricating a peripheral region of a first substrate for an OELD device according to the present invention. For simplicity in explaining the present invention, FIGS. 6A to 6C may be considered to be along IVa—IVa of FIG. 2, and FIGS. 7A to 7C may be considered to be along IVb—IVb of FIG. 3.

In FIGS. 6A and 7A, a buffer layer, i.e., a first insulating layer, may be formed on a first substrate 100 including pixel regions "P," driving regions "D," storage regions "C," and peripheral regions "Peri" by depositing one of a silicon insulating material group including silicon nitride ($SiN_x$) and silicon oxide ($SiO_2$). In addition, first and second active layers 104 and 105 of polycrystalline silicon may be formed on the buffer layer 102 at the driving and storage regions "D" and "C," respectively. For example, the first and second active layers 104 and 105 may be formed through a dehydrogenation process and a crystallization process using heat after deposition of amorphous silicon. The second active layer 105 may function as a first electrode of a storage capacitor by doping the crystallized amorphous silicon with impurities.

A gate insulating layer 106, i.e., a second insulating layer, and a gate electrode 108 may be sequentially formed on the first active layer 104, wherein the gate insulating layer 106 may be formed on an entire surface of the first substrate 100. The gate insulating layer 106 may include an inorganic insulating material, such as silicon nitride ($SiN_x$) and silicon oxide ($SiO_2$), and the gate electrode 108 may be formed of conductive metal material(s), such as aluminum (Al), an aluminum (Al) alloy, copper (Cu), tungsten (W), tantalum (Ta), and molybdenum (Mo)

After forming the gate electrode 108, the first active layer 104 may be doped with impurities, such as boron (B) or phosphorus (P), to define a channel region 104a, and source and drain regions 104b and 104c. An interlayer insulating layer 110, i.e., a third insulating layer may be formed on the gate electrode 108, wherein the interlayer insulating layer 110 may include inorganic insulating material(s), such as silicon nitride ($SiN_x$) and silicon oxide ($SiO_2$).

A capacitor electrode 112 may be formed on the interlayer insulating layer 110 at the storage region "C" by depositing and patterning conductive metal material(s), such as aluminum (Al), an aluminum (Al) alloy, copper (Cu), tungsten (W), tantalum (Ta), and molybdenum (Mo). The second active layer 105 and the capacitor electrode 112 overlapping the second active layer 105 may constitute a storage capacitor with the interlayer insulating layer 110 interposed therebetween.

In FIGS. 6B and 7B, a fourth insulating layer 114 may be formed on the capacitor electrode 112, wherein the fourth insulating layer 114 may include a first contact hole 116 exposing the drain region 104c, a second contact hole 118 exposing the source region 104b, and a third contact hole 120 exposing the capacitor electrode 112.

In FIGS. 6C and 7C, source and drain electrodes 124 and 122 may be formed on the fourth insulating layer 114 by depositing and patterning conductive metal material(s), such as chromium (Cr), molybdenum (Mo), tantalum (Ta), and tungsten (W). The source electrode 124 may contact the source region 104b through the second contact hole 118, and the drain electrode 122 may contact the drain region 104c through the first contact hole 116. At the same time, a first pad 126 may be formed on the fourth insulating layer 114 at the peripheral region "Peri."

A fifth insulating layer 128 including fourth, fifth, and sixth contact holes 134, 136, and 138 may be formed on the source and drain electrodes 124 and 122 and the first pad 126. The fourth contact hole 134 may expose the drain electrode 122, and the fifth and sixth contact holes 136 and 138 may expose both sides of the first pad 126.

First and second connection electrodes 130 and 132 may be formed on the fifth insulating layer 128 by depositing and patterning conductive metal material(s). The first connection electrode 130 may contact the drain electrode 122 through the fourth contact hole 134, and may be disposed at the pixel region "P." The second connection electrode 132 may contact the first pad 126 through the fifth contact hole 136.

Figure 8A:
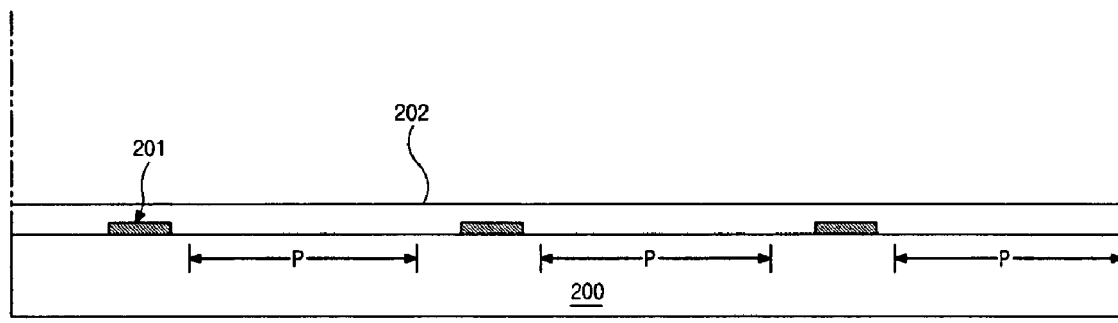
FIGS. 8A to 8C are schematic cross sectional views of an exemplary method of fabricating a second substrate for an OELD device according to the present invention.
Figure 8B:
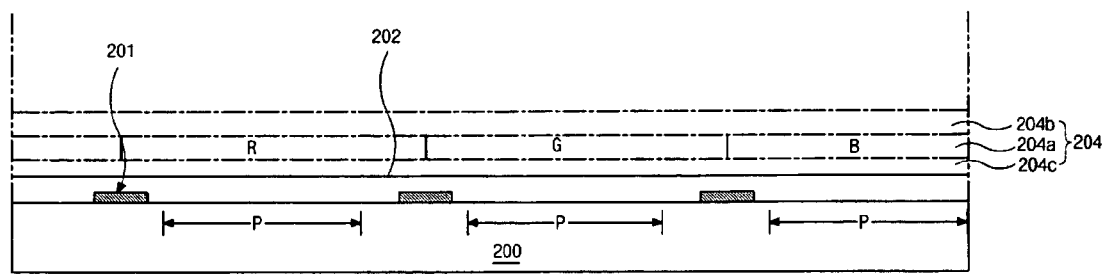
Figure 8C:
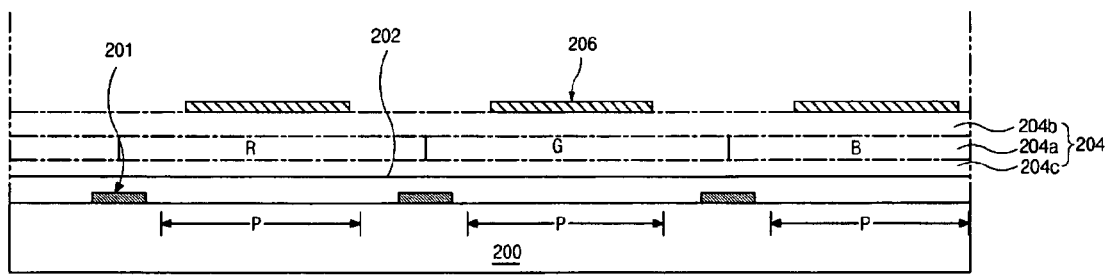

FIGS. 8A to 8C are schematic cross sectional views of an exemplary method of fabricating a second substrate for an OELD device according to the present invention. For simplicity, peripheral regions of a second electrode have not been shown in FIGS. 8A and 8C. In FIG. 8A, a plurality of first auxiliary electrodes 201 may be formed on a second substrate 200 including a plurality of pixel regions "P" by depositing and patterning metal material(s) having low resistance, and a first electrode 202 may be formed on the plurality of first auxiliary electrodes 201. Alternatively, the plurality of first auxiliary electrodes 201 may be omitted when the first electrode 202 has a sufficiently low resistance. Accordingly, when the first electrode 202 does not have a sufficiently low resistance, a signal distortion may be prevented by forming the plurality of first auxiliary electrodes 201 to have a lower resistance than the first electrode 202. The first electrode 202 functions as an anode for injecting holes into an emission layer 204 (in FIG. 8B). For example, the first electrode 202 may include indium-tin-oxide (ITO) or indium-zinc-oxide (IZO).

In FIG. 8B, an emission layer 204 may be formed on the first electrode 202, wherein the emission layer 204 may emit one of red, green, and blue colored light corresponds to each of the plurality of pixel regions "P." The emission layer 204 may have a mono layer or a multiple layer structure. When the emission layer 204 has a multiple layer structure, the emission layer 204 may include an organic emitting layer 204a, a hole transporting layer (HTL) 204b, and an electron transporting layer (ETL) 204c.

In FIG. 8C, a plurality of second electrodes 206 may be formed on the emission layer 204, wherein each of the plurality of second electrodes 206 may correspond to each of the plurality of pixel regions "P." The plurality of second electrodes 206 may function as a cathode for injecting electrons into the emission layer 204. For example, the plurality of second electrodes 206 may include a mono layer structure using aluminum (Al), calcium (Ca), or magnesium (Mg), or a multiple layer structure using lithium fluoride (LiF)/aluminum (Al). The plurality of second electrodes 206 may have a work function lower than the first electrode 202. Although not shown in FIGS. 8A to 8C, a second auxiliary electrode may be simultaneously formed on the first electrode 202 at a peripheral portion with the plurality of second electrodes 206.

The first and second substrates 100 and 200 formed by fabricating processes of FIGS. 6A to 8C may be attached together using a sealant material to form an OELD device. The first and second electrodes 202 and 206 may function as anode and cathode, respectively, or the first and second electrodes 202 and 206 may function as cathode and anode, respectively. Accordingly, when the first electrode 202 functions a cathode, the first pad 126 (in FIG. 7C) may be grounded.

Figure 9:
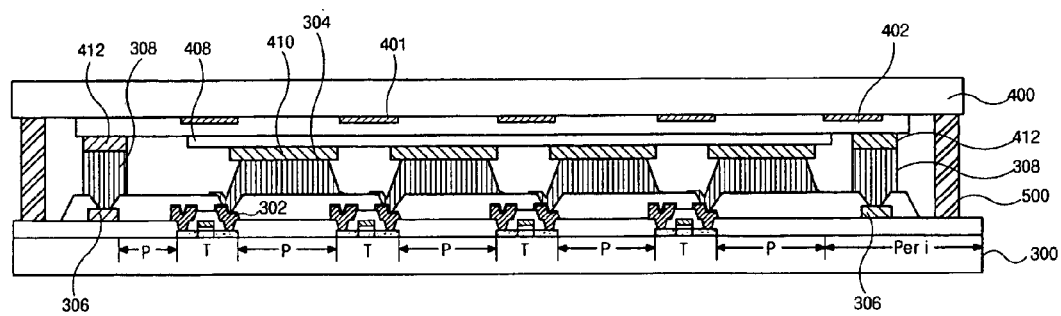
FIG. 9 is a schematic cross sectional view of another exemplary OELD device according to the present invention.

FIG. 9 is a schematic cross sectional view of another exemplary OELD device according to the present invention. In FIG. 9, first and second substrates 300 and 400 may be attached together with a sealant material 500. The first and second substrates 300 and 400 have a plurality of pixel regions "P," a peripheral region "Peri," and may include a plurality of thin film transistors (TFTs) "T" and a plurality of array lines (not shown) formed on an inner surface of the first substrate 300, wherein each of the plurality of TFTs "T" may be disposed adjacent of each of the plurality of pixel regions "P." A plurality of first auxiliary electrodes 401 may be formed on an inner surface of the second substrate 400 and a first electrode 402 may be formed on the plurality of first auxiliary electrodes 401, wherein the first electrode 402 may function as an anode for injecting holes. An emission layer 408 and a plurality of second electrodes 410 may be sequentially formed on the first electrode 402, wherein the plurality of second electrodes 410 may function as a cathode for injecting electrons.

A second auxiliary electrode 412 may be simultaneously formed on the first electrode 402 at the peripheral region "Peri" with the plurality of second electrodes 410. Each of the plurality of second electrodes 410 may be connected to a drain electrode 302 of each TFT "T" through a first connection electrode 304. Accordingly, since the first and second substrates 300 and 400 may be attached together after forming a plurality of first connection electrodes 304, the plurality of first connection electrodes 304 may contact the plurality of second electrodes 410, respectively.

A first pad 306 may be formed on the inner surface at the peripheral region "Peri" of the first substrate 300 and a second connection electrode 308 may be formed on the first pad 306. The second connection electrode 308 may be connected to the first electrode 402 through the second auxiliary electrode 412 after attaching the first and second substrates 300 and 400 together.

In FIG. 9, the first pad 306 and the second connection electrode 308 may be disposed at both sides of the peripheral region "Peri" at an interior of the sealant 500. The second connection electrode 308 and/or the first pad 306 may have a multiple layer structure to improve contact properties between the second connection electrode 308 and the first pad 306. Alternatively, the first pad 306 and the second connection electrode 308 may be disposed at an exterior of the sealant 500.

Figure 10:
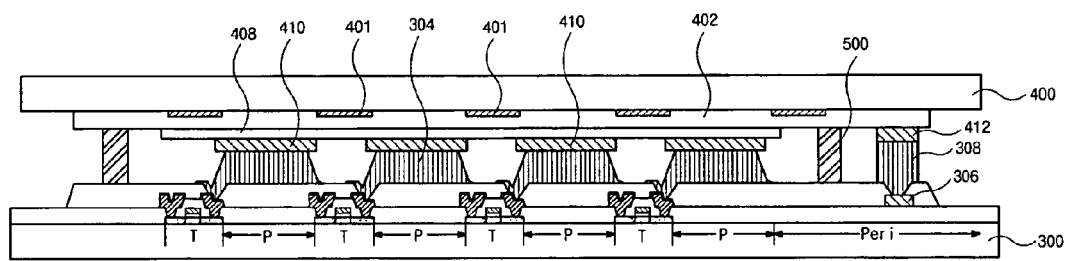
FIG. 10 is a schematic cross sectional view of another exemplary OELD device according to the present invention.

FIG. 10 is a schematic cross sectional view of another exemplary OELD device according to the present invention. In FIG. 10, first and second substrates 300 and 400 may be attached together using a sealant material 500. The first and second substrates 300 and 400 may have a plurality of pixel regions "P," a peripheral region "Peri," and may include a plurality of thin film transistors (TFTs) "T" and a plurality of array lines (not shown) formed on an inner surface of the first substrate 300, wherein each of the plurality of TFTs "T" may be disposed adjacent of each of the plurality of the pixel regions "P."

A plurality of first auxiliary electrodes 401 may be formed on an inner surface of the second substrate 400 and a first electrode 402 may be formed on the plurality of first auxiliary electrodes 401. An emission layer 408 and a plurality of second electrodes 410 may be sequentially formed on the first electrode 402. In addition, a second auxiliary electrode 412 may be simultaneously formed on the first electrode 402 at the peripheral region "Peri" with the plurality of second electrodes 410, wherein each of the plurality of second electrodes 410 may be connected to a drain electrode 302 of each TFT "T" through a first connection electrode 304. Since the first and second substrates 300 and 400 may be attached together after forming a plurality of first connection electrodes 304, the plurality of first connection electrodes 304 may contact the plurality of second electrodes 410, respectively.

A first pad 306 may be formed on the inner surface at the peripheral region "Peri" of the first substrate 300 and a second connection electrode 308 may be formed on the first pad 306. Accordingly, the second connection electrode 308 may be connected to the first electrode 402 through the second auxiliary electrode 412 after attaching the first and second substrates 300 and 400 together. The first pad 306 and the second connection electrode 308 may be disposed at one side of the peripheral region "Peri" at an exterior of the sealant 500.

Although not shown, the first pad 306 and the second connection electrode 308 may be disposed at both sides of the peripheral region "Peri." In addition, the second connection electrode 308 and/or the first pad 306 may have a multiple layer structure to improve contact properties between the second connection electrode 308 and the first pad 306.

In FIG. 10, since the OELD device is a top emission-type OELD device, a high aperture ratio may be obtained. In addition, since an array pattern including a thin film transistor and an organic emission layer may be independently formed on an individual substrate, adverse effects due to fabricating processes of the emission layer may be prevented, and production yield is improved. Moreover, since a second connection pattern may be formed at a peripheral region to contact a first pad and a first electrode, adverse effects due to signal distortion may be prevented, and production yield is further improved.

It will be apparent to those skilled in the art that various modifications and variations can be made in the organic electroluminescent display device and method of fabricating an organic electroluminescent display device of the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
    first and second substrates facing and spaced apart from each other, the first and second substrates having a plurality of pixel regions and a peripheral region surrounding the plurality of pixel regions;
    a first pad disposed at the peripheral region on an inner surface of the first substrate;
    a driving thin film transistor disposed at each of the plurality of pixel regions on the inner surface of the first substrate, the driving thin film transistor including an active layer, a gate electrode, and source and drain electrodes;
    a first connection electrode structure connected to the drain electrode;
    a second connection electrode structure connected to the first pad, the second connection electrode structure being the same as the first connection electrode structure;
    a first electrode on an entire inner surface of the second substrate, the first electrode being connected to the second connection electrode structure;
    an organic emission layer on the first electrode;
    a second electrode on the organic emission layer at each of the plurality of pixel regions, the second electrode being connected to the first connection electrode structure;
    a plurality of first auxiliary electrodes disposed between the plurality of pixel regions; and
    a sealant attaching the first and second substrates together, wherein the plurality of first auxiliary electrodes have lower resistance than the first electrode.

2. The device according to claim 1, wherein the active layer includes polycrystalline silicon.

3. The device according to claim 1, further comprising a power line connected to the driving thin film transistor.

4. The device according to claim 3, further comprising a storage capacitor connected to the gate electrode.

5. The device according to claim 1, wherein the first electrode is an anode for injecting holes into the organic emission layer, and the second electrode is a cathode for injecting electrons into the organic emission layer.

6. The device according to claim 5, wherein the first electrode includes one of indium-tin-oxide (ITO) and indium-zinc-oxide (IZO).

7. The device according to claim 5, wherein the second electrode includes one of calcium (Ca), aluminum (Al) and magnesium (Mg).

8. The device according to claim 1, wherein the first pad and the second connection electrode structure are disposed at an interior of the sealant, and the first pad and the second connection electrode structure are formed on at least one side of the peripheral region.

9. The device according to claim 1, wherein the first pad and the second connection electrode structure are disposed at an exterior of the sealant, and the first pad and the second connection electrode structure are formed on at least one side of the peripheral region.

10. The device according to claim 1, wherein the plurality of first auxiliary electrodes are between the first electrode and the second substrate.

11. The device according to claim 1, further comprising a second auxiliary electrode between the second connection electrode structure and the first electrode, wherein layer structure and materials of the second auxiliary electrode is the same as the second electrode.

12. A method of fabricating an organic electroluminescent device, comprising:
    forming a first insulating layer on a first substrate having a plurality of pixel regions and a peripheral region surrounding the plurality of pixel regions;
    forming an active layer on the first insulating layer at each of the plurality of pixel regions, the active layer including polycrystalline silicon and having source and drain regions;

forming a second insulating layer on the active layer;

forming a gate electrode on the second insulating layer over the active layer;

forming a third insulating layer on the gate electrode, the third insulating layer having a first contact hole exposing the source region and a second contact hole exposing the drain region;

forming source and drain electrodes and a first pad on the third insulating layer, the source electrode being connected to the source region through the first contact hole, the drain electrode being connected to the drain region through the second electrode, and the first pad being disposed at the peripheral region;

forming a fourth insulating layer on the source and drain electrodes and the first pad, the fourth insulating layer having a third contact hole exposing the drain electrode, and fourth and fifth contact holes exposing the first pad;

forming first and second connection electrodes on the fourth insulating layer, the first connection pattern being connected to the drain electrode through third contact hole, the second connection electrode being connected to the first pad through the fourth contact hole;

forming a first electrode on a second substrate having a plurality of pixel regions and a peripheral region surrounding the plurality of pixel regions;

forming an organic emission layer on the first electrode;

forming a second electrode on the organic emission layer at each of the plurality of pixel regions; and attaching the first and second substrates together with a sealant material, wherein the first connection electrode contacts the second electrode, and the second connection electrode contacts the first electrode.

13. The method according to claim 12, wherein the first electrode is an anode for injecting holes into the organic emission layer, and the second electrode is a cathode for injecting electrons into the organic emission layer.

14. The method according to claim 13, wherein the first electrode includes one of indium-tin-oxide (ITO) and indium-zinc-oxide (IZO).

15. The method according to claim 13, wherein the second electrode includes one of calcium (Ca), aluminum (Al) and magnesium (Mg).

16. The method according to claim 12, further comprising:

forming a polycrystalline silicon pattern connected to the gate electrode; and forming a capacitor electrode over the polycrystalline silicon pattern constituting a storage capacitor, wherein the capacitor electrode is connected to the drain electrode.

17. The method according to claim 12, wherein the first pad and the second connection electrode are disposed at an interior of the sealant, and the first pad and the second connection electrode are formed on at least one side of the peripheral region.

18. The method according to claim 12, wherein the first pad and the second connection electrode are disposed at an exterior of the sealant material, and the first pad and the second connection electrode are formed on at least one side of the peripheral region.

19. The method according to claim 12, further comprising forming a plurality of first auxiliary electrodes between the first electrode and the second substrate, wherein the plurality of first auxiliary electrodes are disposed between the plurality of pixel regions, and the plurality of first auxiliary electrodes have lower resistance than the first electrode.

20. The method according to claim 12, further comprising forming a second auxiliary electrode between the second connection electrode and the first electrode, wherein the second auxiliary electrode has the same layer structure and the same materials as the second electrode.

* * * * *

UNITED STATES PATENT AND TRADEMARK OFFICE
CERTIFICATE OF CORRECTION

PATENT NO. : 7,105,999 B2
APPLICATION NO. : 10/608229
DATED : September 12, 2006
INVENTOR(S) : Jae-Yong Park et al.

Page 1 of 1

It is certified that error appears in the above-identified patent and that said Letters Patent is hereby corrected as shown below:

Title Page, item [73], Assignee's address should read -- ~~Tokyo, Japan~~ Seoul, Korea--.

Signed and Sealed this

Fourth Day of December, 2007

JON W. DUDAS
*Director of the United States Patent and Trademark Office*